US007150959B2

(12) United States Patent
Aoshima

(10) Patent No.: US 7,150,959 B2
(45) Date of Patent: Dec. 19, 2006

(54) HEAT-SENSITIVE LITHOGRAPHIC PRINTING PLATE PRECURSOR

(75) Inventor: Norio Aoshima, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/412,271

(22) Filed: Apr. 14, 2003

(65) Prior Publication Data

US 2004/0018443 A1 Jan. 29, 2004

(30) Foreign Application Priority Data

Apr. 15, 2002 (JP) ......................... P. 2002-112095

(51) Int. Cl.
*G03F 7/004* (2006.01)

(52) U.S. Cl. ................... 430/302; 430/138; 430/270.1; 430/271.1; 430/272.1; 430/273.1

(58) Field of Classification Search ................ 430/138, 430/270.1, 271.1, 272.1, 273.1, 302
See application file for complete search history.

(56) References Cited

U.S. PATENT DOCUMENTS 3,511,661 A 5/1970 Rauner et al.
5,962,188 A * 10/1999 DeBoer et al. .......... 430/273.1
6,017,677 A 1/2000 Maemoto et al.
6,242,156 B1 6/2001 Teng
6,397,749 B1 * 6/2002 Kita et al. .................. 101/457
6,399,276 B1 6/2002 Van Damme et al.
6,468,717 B1 * 10/2002 Kita et al. ............... 430/278.1
6,593,057 B1 * 7/2003 Kita ........................ 430/270.1
6,868,787 B1 3/2005 Mori

FOREIGN PATENT DOCUMENTS

EP 1 072 402 A2 * 1/2001
EP 1 134 077 A2 9/2001
JP 06-122287 5/1994
JP 10-31311 2/1998
JP 10-166749 6/1998
JP 10-230582 9/1998
JP 2001-47758 A 2/2001
JP 2003-231374 A 8/2003

OTHER PUBLICATIONS

Patent Abstracts of JP 10-166749, vol. 1998, No. 11.
Patent Abstracts of JP 6-122287, vol. 0184, No. 13.
Communication from Foreign Patent Office (Aug. 24, 2004).

* cited by examiner

*Primary Examiner*—Amanda Walke
(74) *Attorney, Agent, or Firm*—Sughrue Mion, PLLC

(57) ABSTRACT

A heat-sensitive lithographic printing plate precursor comprising on a support, a hydrophilic layer having a protrusion structure on at least one surface thereof.

12 Claims, No Drawings

HEAT-SENSITIVE LITHOGRAPHIC PRINTING PLATE PRECURSOR

FIELD OF THE INVENTION

The present invention relates to a lithographic printing plate precursor for a computer-to-plate system (CTP system), which does not need development. More specifically, the present invention relates to a heat-sensitive lithographic printing plate precursor, which is capable of recording an image by infrared light scanning exposure based on digital signal and is mounted on a printing machine for printing without conventional development step using a liquid processing solution.

BACKGROUNG OF THE INVENTION

In a conventional system for producing a lithographic printing plate, a lithographic printing plate precursor is exposed through a lith film as an intermediate material. However, with recent rapid progress in digitization in the field of printing, a CTP system in which digital data inputted and edited in a computer are outputted directly to a lithographic printing plate precursor has been introduced in the system for producing a lithographic printing plate. For higher efficiency of the process, researches and developments on lithographic printing plate precursors free from development, which can be used for printing without development processing after exposure have been made.

As technique for lithographic printing plate precursor free from development, a method utilizing abrasion is known wherein a lithographic printing plate precursor is exposed to high-output solid infrared laser such as a semiconductor laser and a YAG laser to generate heat with a light-heat converting agent, thereby decomposing and evaporating the exposed portion. Specifically, a hydrophilic layer is formed on a substrate having a lipophilic ink-receptive surface or a lipophilic ink-receptive layer and the hydrophilic layer is removed by abrasion.

In WO94/18005, a printing plate prepared by providing a crosslinked hydrophilic layer on a lipophilic laser-absorbing layer and abrading the hydrophilic layer is described. The hydrophilic layer comprises polyvinyl alcohol crosslinked by a hydrolysate of tetraethoxysilane and particulate titanium dioxide for increasing film strength of the hydrophilic layer. Although printing durability is increased, the above technique is insufficient in stain. Therefore, further improvements have been desired.

In WO98/40212 and WO99/19143, a printing plate precursor having on a substrate, an ink-receptive layer and a hydrophilic layer mainly composed of a colloid such as silica crosslinked by a crosslinking agent such as aminopropyltriethoxysilane, and being mounted on a printing machine without development is described. The hydrophilic layer is intended to increase resistance to the stain owing to a minimized content of hydrocarbon group and to improve the printing durability owing to crosslinking of the colloid by the crosslinking agent. However, the technique is still insufficient because the printing durability is only several thousand sheets.

Furthermore, in case of conventional lithographic printing plate precursor using abrasion method, there is a problem in that scattering of abrasion scum occurs to contaminate a laser exposure apparatus or a light source. Therefore, it is necessary for the laser exposure apparatus to be equipped with a device for scavenging the abrasion scum. However, the scavenging device cannot completely prevent the contamination.

On the other hand, in JP-A-2001-96936 (the term "JP-A" as used herein means an "unexamined published Japanese patent application") it is described that a heat-sensitive lithographic printing plate precursor having a hydrophilic layer being readily removable with dampening water or ink at printing in the heated position and, if desired, a water-soluble overcoat layer containing a light-heat converting agent, on a substrate having an ink-receptive surface or an ink-receptive layer, has good printing durability and high resistance to stain and prevents the contamination of a laser exposure apparatus or a light source due to scattering of abrasion scum.

The above techniques are still not satisfactory in prevention of stain during printing and printing durability.

SUMMARY OF THE INVENTION

An object of the present invention is to solve the above problems.

Another object of the present invention is to provide a heat-sensitive lithographic printing plate precursor, which can be used for printing without development processing after exposure and is improved for the resistance to stain at printing and the printing durability.

The objects of the invention can be attained by the following heat-sensitive lithographic printing plate precursors.

1. A heat-sensitive lithographic printing plate precursor comprising on a support, a hydrophilic layer having a protrusion structure on at least one surface thereof.
2. The heat-sensitive lithographic printing plate precursor described in item 1, wherein (1) an ink-receptive layer and (2) the hydrophilic layer as described in item 1 are provide in this order on the support.
3. The heat-sensitive lithographic printing plate precursor described in item 1, wherein (1) an ink-receptive layer, (2) the hydrophilic layer as described in item 1, and (3) a hydrophilic overcoat layer removable on a printing machine are provide in this order on the support.
4. The heat-sensitive lithographic printing plate precursor described in any one of items 1 to 3, wherein the hydrophilic layer is a layer formed by applying and drying a coating liquid containing a colloidal particulate oxide or hydroxide of at least one element selected from beryllium, magnesium, aluminum, silicon, titanium, boron, germanium, tin, zirconium, iron, vanadium, antimony, and transition metals; and a flocculant.
5. The heat-sensitive lithographic printing plate precursor described in any one of items 2 to 3, wherein the hydrophilic layer contains a colloidal particulate oxide or hydroxide of at least one element selected from beryllium, magnesium, aluminum, silicon, titanium, boron, germanium, tin, zirconium, iron, vanadium, antimony, and transition metals, and the ink-receptive layer contains a flocculant soluble in a solvent for coating the hydrophilic layer.
6. The heat-sensitive lithographic printing plate precursor described in items 4 or 5, wherein the flocculant is a compound capable of forming at least one kind of ion selected from a calcium ion, an aluminum ion, a sodium ion, a potassium ion, a lithium ion, an ammonium ion, a quaternary ammonium ion, a fluoride ion, a chloride ion, a nitrate ion, an acetate ion, a sulfate ion and a phosphate ion.

7. The heat-sensitive lithographic printing plate precursor described in any one of items 1 to 6, wherein the hydrophilic layer contains fine particles of an average diameter ranging from 0.3 to 5.0 μm.
8. The heat-sensitive lithographic printing plate precursor described in any one of items 2 to 7, wherein the hydrophilic layer is a layer formed by applying and drying a coating liquid which contains a solvent capable of dissolving an organic polymer in the ink-receptive layer at a content ranging from 1 to 40% based on the entire solvent of the coating liquid.

DETAILED DESCRIPTION OF THE INVENTION

The present invention will be described in detail below. The unit "percent (%)" is based on weight, unless otherwise indicated.

The heat-sensitive lithographic printing plate precursor of the present invention is characterized by comprising a hydrophilic layer having a protrusion structure on at least one surface thereof on a support. That is, the hydrophilic layer has a protrusion structure on the upper surface and/or the lower surface thereof.

The heat-sensitive lithographic printing plate precursor of the present invention has preferably a layer constitution of an ink-receptive layer and a hydrophilic layer provided in this order on the support. More preferably, a hydrophilic overcoat layer is further provided on the hydrophilic layer.

The protrusion structure on the surface of the hydrophilic layer of the present invention is formed independently of the surface shape of the support or of the ink-receptive layer. The protrusions may be semispherical, ellipsoidal, or columnar in shape, and have a diameter of 0.3 to 5.0 μm and a height of 0.2 to 2.0 μm from the hydrophilic layer surface. More preferably, the protrusions have a diameter of 0.5 to 4.0 μm and a height of 0.3 to 2.0 μm and still more preferably, a diameter of 1.0 to 4.0 μm and a height of 0.5 to 2.0 μm. A height of the protrusion on the lower surface of hydrophilic layer (depth into the ink-receptive layer) is 0.2 to 0.5 μm.

The reason for achieving the improvements in printing durability and resistance to stain is presumed that the downward protrusion of the hydrophilic layer acts to increase adhesiveness between the ink-receptive layer and the hydrophilic layer by an anchor effect and the upward protrusion of the hydrophilic layer acts to increase water retentivity of the hydrophilic layer.

The hydrophilic layer of the present invention contains preferably a colloidal particulate oxide or hydroxide of at least one element selected from beryllium, magnesium, aluminum, silicon, titanium, boron, germanium, tin, zirconium, iron, vanadium, antimony, and transition metals.

The colloidal particulate oxide or hydroxide of such an element is prepared by a conventional method, for example, hydrolysis of a halide or an alkoxy compound or condensation of a hydroxide of the above element in a state of a dispersion phase of a colloidal dispersion liquid, namely colloidal particles. For the preparation of hydrophilic layer, the particles may be added in a state of a colloidal dispersion to a coating liquid for hydrophilic layer.

Of the oxides and hydroxide of elements, particularly preferred are oxides and hydroxides of at least one element selected from aluminum, silicon, titanium, and zirconium.

Of the colloidal particulate oxides or hydroxides of the above elements, those of a spherical shape having particle diameter of 5 to 100 nm, a pearl necklace shape having a length of 50 to 400 nm and a feather shape of 100 nm×10 nm are preferably used. In case of colloidal particles of silica, those of spherical shape are particularly preferred. In case of particulate oxide or hydroxide of aluminum, those of feather shape are particularly preferred. Such colloidal dispersion liquids are commercially available, for example, from Nissan Chemical Industries, Ltd.

The dispersion medium useful for the colloidal particles includes an organic solvent, for example, methanol, ethanol, ethylene glycol monomethyl ether or methyl ethyl ketone, in addition to water.

The protrusion structure on the hydrophilic layer surface, which is one feature of the present invention, can be formed by adding preliminarily a coarse particulate matter, specifically a particulate hydrophilic substance having a diameter of 0.3 to 5 μm, to a coating liquid for the hydrophilic layer. The particulate hydrophilic substance includes, for example, particulate oxides and hydroxides of beryllium, magnesium, aluminum, silicon, titanium, boron, germanium, tin, zirconium, iron, vanadium, antimony and transition metals. This method can be conducted with greater design freedom of the protrusion structure such as shape and dimension.

In another method of the formation of protrusion structure on the hydrophilic surface, a flocculant is added to the coating liquid for hydrophilic layer containing the aforementioned colloidal particulate oxide or hydroxide. The addition of the flocculant causes flocculation of the colloidal particles and the resulting flocks of particles are components for forming the protrusion structure.

The flocculant preferably used includes ionic compounds capable of forming at least one kind of ion, for example, ions of metals such as calcium, aluminum, sodium, potassium and lithium, cations such as ammonium, and quaternary ammonium and anions such as fluoride, chloride, nitrate, acetate, sulfate, and phosphate.

Specific examples of the aforementioned flocculant include inorganic salts and organic salts such as calcium carbonate, calcium chloride, calcium hydroxide, calcium nitrate, calcium citrate, calcium formate, calcium hydrogenphosphate, calcium dihydrogenphosphate, calcium phytate, calcium sulfate, aluminum hydroxide, aluminum phosphate, potassium aluminum sulfate, aluminum silicate, aluminum sulfate, aluminum tartrate, magnesium acetate, magnesium carbonate, magnesium chloride, magnesium citrate, magnesium phosphate, magnesium silicate, potassium acetate, potassium adipate, potassium carbonate, potassium chloride, potassium citrate, potassium diphosphate, potassium metaphosphate, potassium disulfate, sodium acetate, sodium benzenesulfonate, sodium benzoate, sodium carbonate, sodium chloride, sodium dihydrogenphosphate, sodium disulfate, sodium sulfate, sodium formate, sodium hydrogencarbonate, sodium hydroxide, disodium phosphate, monosodium phosphate, potassium sodium carbonate, sodium pyrophosphate, sodium silicate, sodium thiosulphate, sodium tripolyphosphate, lithium citrate, lithium formate, lithium metasilicate, lithium phosphate, lithium sulfate, lithium tetraborate, ammonium acetate, ammonium borate, ammonium bromide, ammonium carbonate, ammonium chloride, ammonium cobalt phosphate, ammonium hydrogencarbonate, ammonium iron citrate, ammonium iron sulfate, ammonium hydrogenphosphate, ammonium dihydrogenphosphate, ammonium citrate, ammonium sulfate, ammonium thiocyanate, tetramethylammonium chloride, tetramethylammonium iodide, dimethylethylbenzylammonium chloride, tetra-n-hexylammonium iodide and tetra-n-decylammonium bromide.

Of the above flocculants, preferred are ammonium salts, particularly preferred are quaternary ammonium salts. Presumably, the ammonium salt as the cation is particularly suitable as the flocculant for the colloidal metal oxide or hydroxide covered with negative electric charges on the surface.

In consideration of the storage stability of the coating liquid, the flocculant is preferably added to the liquid immediately before the coating operation. In another method, the flocculant is diffused from an underlying layer to the hydrophilic layer after application and before the drying. This method is advantageous since the protrusion structure can be formed without the problem of storage stability of the coating liquid. The amount of the flocculant added preliminarily to the coating liquid for hydrophilic layer or eluted during the coating is in the range preferably of 0.1 to 20%, more preferably 0.1 to 10%, still more preferably 0.1 to 5% based on the solid matter in the hydrophilic layer. Within this range, a preferable protrusion structure can be formed without causing deterioration of the film strength of the hydrophilic layer.

The aforementioned protrusion structure can be further improved by employing in combination with the technique disclosed in JP-A-2001-180141 in which a solvent capable of dissolving an organic polymer of the ink-receptive layer is added to the coating liquid for hydrophilic layer. Specifically, the organic solvent will soften, swell, or dissolve the ink-receptive layer to facilitate the formation of the protrusion structure having protrusion penetrating deeply into the ink-receptive layer.

The addition of solvent only without the flocculant addition can form a protrusion-depression structure by mutual dissolving and penetration of the ink-receptive layer and the hydrophilic layer at the interface to improve the printing durability. However, by this method, the height of the protrusion is less than 0.2 μm. On the other hand, the use of coarse particles or colloidal flocculation in the present invention forms protrusion of 0.2 to 0.5 μm downward the hydrophilic layer (into the ink-receptive layer), thereby giving the remarkable anchor effect much greater in comparison with the use of organic solvent only.

For forming a desirable protrusion structure by using together with the solvent capable of dissolving the organic polymer of the ink-receptive layer, the drying time is decided in consideration of balance with the dissolving rate of the ink-receptive layer. An excessively higher drying rate renders insufficient the dissolution of the ink-receptive layer to lower the effect of the solvent addition.

The suitable solvent to be used for formation of the hydrophilic layer to dissolve the organic polymer in the ink-receptive layer may vary depending on the individual organic polymer employed in the ink-receptive layer, so that the solvent cannot be decided generally. Usually, the solvent is selected from alcohols (such as ethylene glycol monomethyl ether, propylene glycol monomethyl ether, and ethylene glycol monoethyl ether), ethers (such as tetrahydrofuran, ethylene glycol dimethyl ether, propylene glycol dimethyl ether, and tetrahydropyran), ketones (such as acetone, methyl ethyl ketone, methyl isobutyl ketone, acetylacetone, and cyclohexanone), esters (such as methyl acetate, ethyl acetate, isobutyl acetate, ethylene glycol monomethyl monoacetate, γ-butyrolactone, methyl lactate, and ethyl lactate), amides (such as formamide, N-methylformamide, pyrrolidone, and N-methylpyrrolidone).

The content of the organic solvent is in the range preferably of 1 to 40%, more preferably 1 to 20% based on the entire solvent of the coating liquid for hydrophilic layer.

In the hydrophilic layer of the present invention, a hydrophilic resin in addition to the above material may be used. The use of the hydrophilic resin strengthens the film property of the hydrophilic layer to improve the printing durability. The hydrophilic resin preferably includes those having a hydrophilic group, for example, hydroxy, carboxy, hydroxyethyl, hydroxypropyl, amino, aminoethyl, aminopropyl or carboxymethyl group.

Specific examples of the hydrophilic resin include gum arabic, casein, gelatin, starch derivatives, carboxymethylcellulose and sodium salt thereof, cellulose acetate, sodium alginate, vinyl acetate-maleic acid copolymers, styrene-maleic acid copolymers, polyacrylic acid and salts thereof, polymetharylic acid and salts thereof, hydroxyethyl methacrylate homopolymers and copolymers, hydroxyethyl acrylate homopolymers and copolymers, hydroxypropyl methacrylate homopolymers and copolymers, hydroxypropyl acrylate homopolymers and copolymers, hydroxybutyl methacrylate homopolymers and copolymers, hydroxybutyl acrylate homopolymers and copolymers, polyethylene glycol, polypropylene oxide, polyvinyl alcohol, hydrolyzed polyvinyl acetate of hydrolysis degree of at least 60%, preferably at least 80%, polyvinylformal, polyvinylbutyral, polyvinylpyrrolidone, acrylamide homopolymers and copolymers, methacrylamide homopolymers and copolymers, and N-methylolacrylamide homopolymers and copolymers.

The ratio of addition of the hydrophilic resin is preferably not higher than 40%, more preferably not higher than 20% based on the solid matter of the hydrophilic layer.

In the hydrophilic layer of the present invention, a resin, which has an aromatic hydroxy group, may also be employed. The resin having an aromatic hydroxy group will improve the film property, and ink receptivity at the start of printing. The resin having an aromatic hydroxy group preferably has a solubility in methanol of 5% or higher at 25° C., and includes alkali-soluble resins, for example, novolac resins, resol resins, polyvinylphenol resins, and ketone-pyrogallol resins.

The preferable novolac resins include those produced by addition-condensation of at least one of the hydroxy group-containing aromatic compound selected from phenol, o-cresol, m-cresol, p-cresol, 2,5-xylenol, 3,5-xylenol, and resorcin with at least one aldehyde selected from formaldehyde, acetaldehyde, propionaldehyde in the presence of an acidic catalyst. The formaldehyde and the acetaldehyde may be replaced by paraformaldehyde and paraldehyde, respectively.

Of the above novolac resins, particularly preferred are addition-condensation products of a mixture of m-cresol, p-cresol, 2,5-xylenol, 3,5-xylenol and resorcin at a molar mixing ratio of 40 to 100:0 to 50:0 to 20:0 to 20:0 to 20 or a mixture of phenol, m-cresol and p-cresol at a molar mixing ratio of 1 to 100:0 to 70:0 to 60, with an aldehyde. Of the aldehydes, formaldehyde is particularly preferred. The weight-average molecular weight of the novolac resin is in the range of preferably 1,000 to 15,000, more preferably 1,500 to 10,000.

The preferable resol resins include those produced by addition-condensation of at least one hydroxyl group-containing aromatic hydrocarbon selected from phenol, m-cresol, o-cresol, p-cresol, 2,5-xylenol, 3,5-xylenol, resorcin, pyrogallol, bis-(4-hydroxyphenyl)methane, bisphenol-A, o-ethylphenol, m-ethylphenol, p-ethylphenol, propylphenol, n-butylphenol, tert-butylphenol, 1-naphthol, and 2-naphthol and polynuclear aromatic hydrocarbons having two or more hydroxy groups with at least one aldehyde or ketone selected from aldehyde, for example, formaldehyde, acetaldehyde, propionaldehyde, benzaldehyde, furfural and ketone, for example, acetone, methyl ethyl ketone, methyl isobutyl ketone in the presence of an alkaline catalyst.

The formaldehyde and the acetaldehyde may be replaced respectively by paraformaldehyde and paraldehyde, respectively. The weight-average molecular weight of the resol resin is in the range of preferably 500 to 10,000, particularly preferably 1,000 to 5,000.

The preferable polyvinylphenol resins include homopolymers of hydroxystyrenes such as o-hydroxystyrene, m-hydroxystyrene, p-hydroxystyrene, 2-(o-hydroxyphenyl)propylene, 2-(m-hydroxyphenyl)propylene and 2-(p-hydroxyphenyl)propylene, and copolymers of two or more thereof. The hydroxystyrene may be substituted by a halogen such as chlorine, bromine, iodine or fluorine or an alkyl group of 1 to 4 carbon atoms on the aromatic ring. Therefore, the polyvinylphenols may have a halogen or, an alkyl group of 1 to 4 carbon atoms on the aromatic ring.

Additionally, as the polyvinylphenol resin, useful are copolymers of hydroxystyrenes such as o-hydroxystyrene, m-hydroxystyrene, p-hydroxystyrene, 2-(o-hydroxyphenyl) propylene, 2-(m-hydroxyphenyl)propylene and 2-(p-hydroxyphenyl)propylene with methacrylic acid, acrylic acid, an alkyl methacrylate or an alkyl acrylate ester.

The polyvinylphenol resin is produced usually by polymerizing a substituted or unsubstituted hydroxystyrene singly or in combination of two or more thereof in the presence of a radical polymerization initiator or a cationic polymerization initiator. The polyvinylphenol resin may be partially hydrogenated. A part of the hydroxy groups of the polyvinylphenol resin may be protected by a group, for example, tert-butoxycarbonyl, pyranyl or furanyl group. The weight-average molecular weight of the polyvinylphenol resin is in the range of preferably 1,000 to 100,000, particularly preferably 1,500 to 50,000.

As the ketone-pyrogallol resin, particularly useful are acetone-pyrogallol resins.

Such an aromatic hydroxy group-containing resin is used in an amount of preferably not more than 20%, more preferably not more than 12% based on the solid matter of the hydrophilic layer.

The hydrophilic layer of the present invention may contain a crosslinking agent to promote crosslinking of the colloidal oxide or hydroxide. The crosslinking agent includes initial hydrolytic condensation product of tetraalkoxysilane, trialkoxysilylpropyl-N,N,N-trialkylammonium halide and aminopropyltrialkoxysilane. The ratio of addition thereof is not more than 5% of the solid matter of the hydrophilic layer.

For the purpose of improving the printing durability in printing, a crosslinking agent for the hydrophilic resin or the aromatic hydroxy group-containing resin may be added to the hydrophilic layer of the present invention. The crosslinking agent includes formaldehyde, glyoxal, polyisocyanate, initial hydrolytic condensation product of tetraalkoxysilane, dimethylol urea and hexamethylolmelamine.

The hydrophilic layer of the present invention may contain a colorant in an amount of about 0.1 to 5% of the total solid matter of the hydrophilic layer. The colorant includes Brilliant Green, Ethyl Violet, Methyl Green, Crystal Violet, Basic Fuchsine, Methyl Violet 2B, Quinaldine Red, Rose Bengal, Metanyl Yellow, Thymolsulfophthalein, Xylenol Blue, Methyl Orange, Paramethyl Red, Congo Red, Benzopurprin 4B, α-Naphthyl Red, Nile Blue 2B, Nile Blue A, Methyl Violet, Malachite Green, Paratuchsine, Victoria Pure Blue BOH (produced by Hodogaya Chemical Co.), Basic Violet (produced by Hodogaya Chemical Co.), m-Cresol Purple, Cresol Red, Rhodamine B, Rhodamine 6G, Sulforhodamine B and Auramine.

Further, for improving the surface property of coating, a known surfactant such as fluorine type surfactant, silicone type surfactant or polyoxyethylene type surfactant may be added to the hydrophilic layer of the present invention.

The hydrophilic layer of the present invention can be formed by applying a solution or dispersion of the above components in a solvent. The main solvent for the coating liquid for hydrophilic layer includes water and a low-boiling alcohol such as methanol, ethanol or propanol, singly or in combination thereof.

The hydrophilic layer of the present invention is formed in a dried amount of preferably 0.2 to 0.8 $g/m^2$, more preferably 0.3 to 0.5 $g/m^2$. Within such a range, a preferred printing durability can be obtained without causing deterioration of on-machine developability or decrease in sensitivity.

The ink-receptive layer employed in the present invention contains an organic polymer. The organic polymer is soluble in a solvent and capable of forming a lipophilic coating film. The organic polymer is preferably insoluble in the coating solvent of the upper hydrophilic layer. In some cases, however, the organic polymer capable of swelling partially in the coating solvent of the upper layer is preferably used because of adhesiveness to the hydrophilic layer. In case of using an organic polymer soluble in the coating solvent of the hydrophilic layer, the ink-receptive layer is preferably cured, for example, by addition of a crosslinking agent.

The useful organic polymer includes polyesters, polyurethanes, polyureas, polyimides, polysiloxanes, polycarbonates, phenoxy resins, epoxy resins, novolac resins, resol resins, condensation resins of a phenol compound and acetone, polyvinyl acetates, acrylic resins and copolymers thereof, polyvinylphenols, polyvinyl halogenated phenols, methacrylic resins and copolymers thereof, acrylamide copolymers, methacrylamide copolymers, polyvinylformals, polyamides, polyvinylbutyrals, polystyrenes, cellulose ester resins, polyvinyl chlorides, and polyvinylidene chlorides.

Of these organic polymers, preferred are resins which have a hydroxy, carboxy, sulfonamido or trialkoxysilyl group in the side chain since such a polymer exhibits good adhesiveness to a substrate or the upper hydrophilic layer, or can be readily cured with a crosslinking agent.

Other preferred resins are acrylonitrile copolymers, polyurethanes and copolymers having a sulfonamido or hydroxy group in the side chain, which are cured with a diazo resin by light.

The epoxy resins suitable for the ink-receptive layer of the present invention include bisphenol-A/epichlorohydrin polyaddition products, bisphenol F/epichlorohydrin polyaddition products, halogenated bisphenol A/epichlorohydrin polyaddition products, biphenyl-type bisphenol/epichlorohydrin polyaddition products and novolac resin/epichlorohydrin polyaddition products. Specific examples thereof include Epicoat 1001 (softening point: 68° C., Mn: about 900), Epicoat 1007 (softening point: 128° C., Mn: about 2900), Epicoat 1009 (softening point: 144° C., Mn: about 3750), Epicoat 1010 (softening point: 169° C., Mn: about 5500), Epicoat 1100L (softening point: 149° C.) and Epicoat YX31575 (softening point: 130° C.), the above Epicoat resins being produced by Japan Epoxy Resins Co., Ltd.

The novolac resins and resol resins include addition condensation products of a phenol such as phenol, cresol (m-cresol, p-cresol, and m/p-mixed cresol), phenol/cresol (m-cresol, p-cresol, and m/p-mixed cresol), phenol-modified xylene, t-butylphenol, octylphenol, resorcinol, pyrogallol, cathecol, chlorophenol (m-Cl, and p-Cl), bromophenol (m-Br, and p-Br), salicylic acid or phloroglucinol with an aldehyde such as formaldehyde or paraldehyde. p Other suitable polymer compounds include copolymers having any one of the monomer units shown in items (1) to (12) below, and having weight average molecular weight of usually 10,000 to 200,000.

(1) Acrylamides, methacrylamides, acrylic esters, methacrylic esters and hydroxystyrenes, which have an aromatic hydroxy group: e.g., N-(4-hydroxyphenyl)acrylamide, N-(4-hydroxyphenyl)methacrylamide, o-, m- and p-hydroxystyrene and o-, m- and p-hydroxyphenyl acrylate or methacrylate;

(2) Acrylic esters and methacrylic esters having an aliphatic hydroxy group: e.g., 2-hydroxyethyl acrylate and 2-hydroxyethyl methacrylate;

(3) Acrylate esters: e.g., methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate and N,N-dimethylaminoethyl acrylate;

(4) Methacrylic esters: e.g., methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate and N,N-dimethylaminoethyl methacrylate;

(5) Acrylamides and methacrylamides: e.g., acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylmethacrylamide, N-cyclohexylmethacrylamide, N-hydroxyethylacrylamide, N-hydroxyethylmethacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide and N-ethyl-N-phenylmethacrylamide;

(6) Vinyl ethers: e.g., ethyl vinyl ether, 2-chloroethyl vinyl ether, hydroxyethyl vinyl ether, propyl vinyl ether, butyl vinyl ether, octyl vinyl ether and phenyl vinyl ether;

(7) Vinyl esters: e.g., vinyl acetate, vinyl chloroacetate, vinyl butyrate and vinyl benzoate;

(8) Styrenes: e.g., styrene, methylstyrene and chloromethylstyrene;

(9) Vinyl ketones: e.g., methyl vinyl ketone, ethyl vinyl ketone, propyl vinyl ketone and phenyl vinyl ketone;

(10) Olefins: e.g., ethylene, propylene, isobutylene, butadiene and isoprene;

(11) N-Vinylpyrrolidone, N-vinylcarbazole, 4-vinylpyridin, acrylonitrile and methacrylonitrile;

(12) Acrylamides and methacrylamides containing sulfonamido group: e.g., N-(o-aminosulfonylphenyl)acrylamide, N-(m-aminosulfonylphenyl)acrylamide, N-(p-aminosulfonylphenyl)acrylamide, N-[1-(3-aminosulfonyl)naphthyl]acrylamide, N-(2-aminosulfonylethyl)acrylamide, N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide and N-(2-aminosulfonylethyl) methacrylamide; and acrylate esters and methacrylate esters containing a sulfonamido group, e.g., o-aminosulfonylphenyl acrylate, m-aminosulfonylphenyl acrylate, p-aminosulfonylphenyl acrylate, aminosulfonylphenyl-naphthyl) acrylate, o-aminosulfonylphenyl methacrylate, m-aminosulfonylphenyl methacrylate, p-aminosulfonylphenyl methacrylate and 1-(3-aminosulfonylphenyl-naphthyl) methacrylate.

The ink-receptive layer can be formed on a substrate by applying and drying a solution of the aforementioned organic polymer dissolved in an appropriate solvent on the substrate. The solution may contain a crosslinking agent, an adhesion auxiliary, a colorant, surface property-improving agent or a plasticizer, if desired, although the solution containing only the organic polymer is useful. The solution may further contain a heat-coloring type or heat-decoloring type additive for forming a print-out image after exposure.

The crosslinking agent for crosslinking the organic polymer includes diazo resins, aromatic azide compounds, epoxy resins, isocyanate compounds, blocked isocyanate compounds, initial hydrolysis condensation products of tetraalkoxysilanes, glyoxal, aldehyde compounds, and methylol compounds.

The useful adhesive auxiliary includes the above diazo resins in view of the adhesiveness between the substrate and the hydrophilic layer, and further includes silane coupling agents, isocyanate compounds and titanium type coupling agents.

The useful colorant includes conventional dyes and pigments, specifically exemplified by the colorant described above for the hydrophilic layer. The amount added is usually in the range of about 0.02 to 10%, preferably about 0.1 to 5% based on the total solid matter of the ink-receptive layer.

The surface property-improving agent includes well-known fluorine type surfactants and silicone type surfactants. Specifically, surfactants having a perfluoroalkyl group or a dimethylsiloxane group are useful for improving the surface property of the coated layer.

The plasticizer for giving flexibility and other properties to the coating film includes polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid and methacrylic acid.

The coloring or decoloring additive for print-out to be added to the ink-receptive layer of the present invention includes combinations of a thermal acid-generating agent with a leuco dye (such as leuco Malachite Green, leuco Crystal Violet and Crystal Violet lactone) or a pH-discoloring dye (dyes such as Ethyl Violet and Victoria Pure Blue-BOH). Further, combinations of an acid color-forming dye and an acidic binder disclosed in EP 897,134 are effective. In this case, heating breaks the bonding of the dye-forming association state to form a lactone thereby changing the dye from a colored state to a colorless state. Such an additive is added in an amount of preferably not more than 10%, more preferably not more than 5% based on the solid matter in the ink-receptive layer.

The solvent used for coating of the aforementioned ink-receptive layer includes alcohols (such as methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether), ethers (such as tetrahydrofuran, ethylene glycol dimethyl ether, propylene glycol dimethyl ether and tetrahydropyran), ketones (such as acetone, methyl ethyl ketone and acetylacetone), esters (such as methyl acetate, ethyl acetate, ethylene glycol monomethyl ether monoacetate, γ-butyrolactone, methyl lactate and ethyl lactate), and amides (such as formamide, N-methylformamide, pyrrolidone and N-methylpyrrolidone). The solvent may be used singly or in combination of two or more thereof. The concentration of the above ink-receptive layer components (total solid matter including the additives) in the coating liquid is in the range of preferably 1 to 50%. The ink-receptive layer can be formed not only by application of the solution in an organic solvent as described above but also by application of an aqueous emulsion. In the emulsion application, the component concentration is preferably in the range of 5 to 50%.

The dry coating weight of the ink-receptive layer is in the range of preferably 0.2 to 2.0 g/m$^2$, more preferably 0.2 to 1.0 g/m$^2$, particularly preferably 0.2 to 0.5 g/m$^2$. When the substrate having a roughened surface is used, the protrusions on the lower surface of the hydrophilic layer are formed in correspondence with the valley portions of the roughened surface, namely in the thicker portion of the ink-receptive layer, whereby satisfactory protrusions are obtained even with a lower coating amount within the aforementioned coating weight range.

The heat-sensitive lithographic printing plate precursor of the present invention is preferably provided with a hydrophilic overcoat layer on the hydrophilic layer for the purpose of prevention of abrasion scum, prevention of stain or damage of the hydrophilic layer due to a lipophilic matter during storage or handling, and prevention of finger-printing in handling by a bare hand.

The hydrophilic overcoat layer is removable on a printing machine and contains a resin selected from water-soluble resins and water-swelling resins formed by partially crosslinking water-soluble resin.

The water-soluble resin is selected from water-soluble natural polymers and water-soluble synthetic polymers, used in combination with a crosslinking agent, and capable of forming a film when applied and dried.

The suitable water-soluble resin specifically include natural polymers such as gum arabic, water-soluble soy-bean polysaccharides, cellulose derivatives (e.g., carboxymethylcellulose, carboxyethylcellulose and methylcellulose) and modifications thereof, white dextrin, pullulan, and enzyme-decomposed etherified dextrin; and synthetic polymers such as polyvinyl alcohols (polyvinyl acetate hydrolyzed at a hydrolysis degree of 65% or higher), polyacrylic acid and alkali metal salts or amine salts thereof, polyacrylic acid copolymers and metal salts or amine salts thereof, polymethacrylic acid and alkali metal salts and amine salts thereof, vinyl alcohol/acrylic acid copolymers and alkali metal salts and amine salts thereof, polyacrylamides and copolymers thereof, poly(hydroxyethyl acrylate), polyvinylpyrrolidone and copolymers thereof, polyvinyl methyl ether, vinyl methyl ether/maleic anhydride copolymers, poly-2-acrylamido-2-methyl-1-propanesulfonic acid and alkali metal salts and amine salts thereof and poly-2-acrylamido-2-methyl-1-propanesulfonic acid copolymers and alkali metal salts and amine salts thereof. Two or more of the resins may be used in combination depending on the purpose. The present invention is not limited to the above examples.

In the formation of an overcoat layer on the hydrophilic layer using one or more partially crosslinked water-soluble resins, the crosslinking can be formed by crosslinking reaction utilizing the reactive functional group of the water-soluble resin. The crosslinking may be either covalent or ionic.

The crosslinking lowers the stickiness of the overcoat layer surface to facilitate the handling. However, excessive crosslinking makes the overcoat layer lipophilic to render difficult the removal of the overcoat layer on a printing machine. Therefore, the partial crosslinking is controlled in an appropriate degree.

The preferable degree of the crosslinking is such that when the printing plate precursor is immersed in water at 25° C., the hydrophilic overcoat layer remains for 30 seconds to 10 minutes without dissolution but the dissolution thereof is observed after 10 minutes.

The compound used for the crosslinking reaction includes known multifunctional compounds capable of crosslinking, for example, polyepoxy compounds, polyisocyanate compounds, polyalkoxysilyl compounds, multivalent metal salt compounds, polyamine compounds, aldehyde compounds and hydrazines. The crosslinking reaction can be accelerated by addition of a known catalyst.

The polyepoxy compounds specifically include glycerin polyglycidyl ether, polyethylene glycol diglycidyl ether, polypropylene glycol diglycidyl ether, trimethylolpropane polyglycidyl ether, sorbitol polyglycidyl ether, polycondensation products prepared from a bisphenol or hydrogenation products thereof and epihalohydrin.

The polyamines specifically include ethylenediamine, diethylenetriamine, triethylenetetramine, tetraethylenepentamine, hexamethylenediamine, propylenediamine, polyethylenimines, and polyamidoamines.

The polyisocyanate compounds specifically include aromatic isocyanates such as tolylene diisocyanate, diphenylmethane diisocyanate, liquid diphenylmethane diisocyanate, polymethylenepolyphenyl isocyanate, xylylene diisocyanate, naphthalene 1,5-isocyanate, cyclohexanephenylene diisocyanate, isopropylbenzene-2,4-diisocyanate; aliphatic isocyanates such as hexamethylene diisocyanate, and decamethylene diisocyanate; alicyclic diisocyanates such as cyclohexyl diisocyanate, and isophorone diisocyanate; and polypropylene glycol/tolylene diisocyanate adduct.

The silane compounds specifically include methyltrimethoxysilane, methyltriethoxysilane, ethyltriethoxysilane, phenyltriethoxysilane, vinyltriethoxysilane, γ-aminopropyltriethoxysilane, N-(β-aminoethyl)-γ-aminopropyltrimethoxysilane, γ-glycidoxypropyltrimethoxysilane, γ-methacryloxypropyltrimethoxysilane, γ-mercaptopropyltrimethoxysilane, β-(3,4-epoxycyclohexyl) ethyltrimethoxysilane, dimethydimethoxysilane, dimethyldiethoxysilane, diphenyldiethoxysilane, 3-chloropropylmethyldimethoxysilane, vinyl tris(methylethylketoxime)silane, methyl tris(methylethylketoxime)silane, and vinyltriacetoxysilane.

The titanate compounds specifically include tetraethyl orthotitanate, bis(dioctyl pyrophosphate)ethylene titanate, isopropyl trioctanoyl titanate, isopropyl dimethacryl isostearoyl titanate, isopropyl isostearoyl diacryl titanate, isopropyl (dioctyl phosphate) titanate, isopropyl tricumylphenyl titanate, isopropyl tri(N-aminoethylaminoethyl) titanate, dicumyl phenyloxyacetate titanate, diisostearoyl ethylene titanate, isopropyl triisostearoyl titanate, isopropyl tridodecylbenzenesulfonyl titanate, isopropyl tris(dioctyl phosphate) titanate, tetraisopropyl bis(dioctyl phosphite) titanate, tetraoctyl bis(ditridecyl phosphite) titanate, tetra(2,2-diallyloxymethyl-1-butyl)bis(ditridecyl phosphite) titanate, and bis(dioctyl pyrophosphate) oxyacetate titanate.

The aldehyde compounds specifically include formaldehyde, acetaldehyde, propylaldehyde, butylaldehyde, glyoxal, glutaraldehyde, and terephthalaldehyde.

The multivalent metal salt compounds specifically include water-soluble salts of metals such as zinc, calcium, magnesium, barium, strontium, cobalt, manganese, and nickel.

The crosslinking agents may be used singly or in combination of two or more thereof. Of these crosslinking agents, particularly preferred are water-soluble crosslinking agents. Water-insoluble crosslinking agents can be used as a dispersion in water with a dispersant.

Particularly preferred combinations of the water-soluble resin and the crosslinking agents are carboxylic acid-containing water-soluble resins/multivalent metal compounds, carboxylic acid-containing water-soluble resins/water-soluble epoxy resins, hydroxyl group-containing resins/dialdehydes.

The crosslinking agent is preferably used in an amount of 0.5 to 10% based on the water-soluble resin within this range, sufficient water resistance can be obtained without deteriorating removability of the overcoat layer on a printing machine.

For uniform formation of the overcoat layer, a nonionic surfactant may be added in case of an aqueous coating liquid. The nonionic surfactant specifically includes sorbitan tristearate, sorbitan monopalmitate, sorbitan trioleate, stearic monoglyceride, polyoxyethylene nonylphenyl ether, and polyoxyethylene dodecyl ether.

The nonionic surfactant is preferably used at a ratio of 0.05 to 5% of the entire solid matter of the overcoat layer.

For prevention of sticking during storage between piled lithographic printing plate precursors, the overcoat layer of the present invention may contain a fluorine atom- and/or silicon atom-containing compound described in JP-A-2001-341448, for example, water-soluble or water-dispersible fluorine-type surfactants and water-soluble or water-dispersible silicone oils.

The dried amount of the overcoat layer in the present invention is in the range of preferably 0.1 to 4.0 g/m$^2$, more preferably 0.1 to 1.0 g/m$^2$, particularly preferably 0.10 to 0.25 g/m$^2$. Within this range, generation of abrasion scum, contamination, damaging and finger-print staining are prevented effectively without deteriorating the removability of the overcoat layer on a printing machine.

For increasing the sensitivity, a light-heat converting agent having a function of converting light to heat is preferably incorporated into at least one of the ink-receptive layer, the hydrophilic layer and the overcoat layer in the present invention. The light-heat converting agent may be any substance capable of absorbing infrared light, particularly near-infrared light (wavelength of 700 to 2,000 nm), and includes various known pigments, dyes, and fine particulate metals.

The suitable substances are pigments, dyes, and fine particulate metals described, for example, in JP-A-2001-301350, Nippon Insatsu Gakkai-shi (Journal of Japan Printing Society) vol.38, pp.35–40 (2001) "New Imaging Materials, 2. Near-Infrared Light Absorbing Dyes". The pigments and the fine particulate metal may be surface-treated by a known method, if desired.

The dyes specifically include cyanine dyes, polymethine dyes, azomethine dyes, squalirium dyes, pyrylium and thiopyrylium salt type dyes, dithiol metal complexes and phthalocyanine dyes described, for example, in U.S. Pat. Nos. 4,756,993 and 4,973,572, JP-A-10-268512, JP-A-11-235883, JP-B-5-13514 (the term "JP-B" as used herein means an "examined Japanese patent publication"), JP-B-5-19702, JP-A-2001-347765.

The pigments includes insoluble azo dyes, azo lake pigments, condensed azo pigments, chelate azo pigments, phthalocyanine pigments, anthraquinone pigments, perylene and perynone pigments, thioindigo pigments, quinacridone pigments, dioxazine pigments, isoindolinone pigments, quinophthalone pigments, Reichardt's dyes, azine pigments, nitroso pigments, nitro pigments, natural pigments, fluorescent pigments, inorganic pigments and carbon black. Of these, carbon black is particularly preferred.

The preferred fine particulate metal includes fine particles of Ag, Au, Cu, Sb, Ge and Pb, and particularly preferred are fine particles of Ag, Au and Cu.

The amount of the light-heat converting agent to be added to the hydrophilic layer is in the range of preferably 1 to 50% based on the solid matter in the hydrophilic layer, that to be added to the overcoat layer, 2 to 50% based on the solid matter in the overcoat layer, and that to be added to the ink-receptive layer, not more than 20% based on the solid matter in the ink-receptive layer. Within this range, sufficient sensitivity is obtained without damaging the film strength of each of the layers.

A material of the support used in the present invention includes aluminum plate, zinc plate, bimetal plate such as cupper-aluminum plate, copper-stainless steel plate and chromium-copper plate, and trimetal plate such as chromium-copper-aluminum plate, chromium-lead-iron plate and chromium-copper-stainless steel plate. The thickness thereof is in the range of preferably 0.05 to 0.6 mm, more preferably 0.1 to 0.4 mm, still more preferably 0.15 to 0.3 mm. Useful materials include paper subjected to water resistance treatment or plastic film (such as film of cellulose diacetate, cellulose triacetate, cellulose propionate, cellulose butyrate, cellulose acetate butyrate, polyethylene terephthalate, polyethylene, polystyrene, polypropylene, polycarbonate and polyvinylacetal) having a thickness of 80 to 200 μm, and paper or plastic film laminated with metal foil. Of these, preferred are aluminum plate and polyester film.

The support may be subjected to known surface treatment to increase adhesion to the upper layer applied. The plastic film is subjected, for example, to a surface treatment such as corona discharge treatment, plasma treatment or blast treatment, or application of an adhesive of acrylic type, urethane type, cellulose type, or epoxy type.

For the aluminum support, conventionally known and used aluminum plates are appropriately employed. Specifically, the aluminum plate for support may be a pure aluminum plate or an alloy plate mainly composed of aluminum and containing small amount of a foreign element. The foreign element contained in the aluminum alloy includes, for example, silicon, iron, manganese, copper, magnesium, chromium, zinc, bismuth, nickel and titanium. The content of the foreign element in the alloy is not higher then 10%. The aluminum plate may be that formed from DC-cast aluminum ingot or continuously cast aluminum ingot.

The aluminum support is subjected to a conventionally known surface treatment, for example, surface roughening treatment, anodizing treatment, enlargement of anodized pores, pore-sealing treatment and treatment for surface hydrophilicity.

The roughening treatment of the aluminum plate surface can be conducted in various manners, such as mechanical roughening treatment, electrochemical dissolution of the surface, chemically selective dissolution of the surface, and combinations of two or more of the treatments. The mechanical roughening treatment can be conducted by a known method such as ball graining, brush graining, blast graining and buff graining. The chemical treatment can be conducted suitably by immersion of the plate in a saturated aqueous solution of an aluminum salt of a mineral acid as described in JP-A-54-31187. The electrochemical roughening can be conducted by electrolytic treatment in an electrolytic solution containing an acid such as hydrochloric acid or nitric acid with AC or DC current. The electrochemical treatment can also be conducted by electrolytic roughening with a mixed acid as disclosed in JP-A-54-63902.

The roughened aluminum plate may be subjected, if desired, to alkali etching with an aqueous solution of potassium hydroxide or sodium hydroxide, and be treated for neutralization, and may further be treated for anodization.

The electrolyte used in the anodizing treatment of the aluminum plate includes various electrolytes capable of forming porous oxide layer. Ordinarily used are sulfuric acid, phosphoric acid, oxalic acid, chromic acid, sulfamic acid, benzenesulfonic acid and mixed acids thereof. The concentration of the electrolyte is decided appropriately depending on the kind of the electrolyte.

The conditions of the anodization may vary depending on the electrolyte employed and cannot be commonly specified, but ordinarily in the range as follows: electrolyte concentration of 1 to 80%; solution temperature of 5 to 70° C.; current density of 5 to 60 A/cm$^2$; voltage of 1 to 100 V; and electrolysis time of 10 seconds to 50 minutes of the anodization treatments, preferred are the anodization in sulfuric acid at a high current density as described in British Patent 1,412,768, and the anodization employing phosphoric acid as the electrolysis bath as described in U.S. Pat. No. 3,511,661.

The amount of the oxide layer of aluminum support in the present invention is preferably not less than 3.0 g/m$^2$ but less than 5.0 g/m$^2$, more preferably in the range of 3.2 to 4.5 g/m$^2$, most preferably 3.5 to 4.0 g/m$^2$. Within this range, preferable thermal insulation effect can be achieved. With the amount of the oxide layer of less than 3.0 g/m$^2$, the thermal insulation effect is insufficient. On the other hand, with the amount of not less than 5.0 g/m$^2$, the thermal insulation effect is insufficient. This is presumably because, with increase of the amount of the oxide layer, the diameter of the outside opening of the pore of the oxide layer becomes larger to allow the ink-receptive layer to penetrate into the pores and to prevent the thermal insulation by the air in the pore, thereby promoting the heat diffusion into the support.

The aforementioned support surface-treated and having the anodized layer may used as the support in the present invention without additional treatment. However, the support may further be selectively subjected to additional treatment such as sealing of micropores of the anodized layer as described in JP-A-2001-253181, and treatment for hydrophilicity by immersion in an aqueous solution containing a hydrophilic compound as described in JP-A-2001-322365.

The hydrophilic compound suitable for the above hydrophilicity treatment includes polyvinylphosphonic acid, compounds having a sulfonic acid group, sugar compounds, citric acid, alkali metal silicates, potassium fluorozirconate and phosphate salt/inorganic fluorine compound.

The aluminum substrate obtained as above has a surface roughness of a center line average roughness Ra of preferably not less than 0.45 μm, more preferably not less than 0.48 μm, still more preferably not less than 0.52 μm. The upper limit of Ra value may vary depending on the thickness of the ink-receptive layer and cannot be decided generally, but is ordinarily not more than about 0.7 μm.

An image (latent image) is formed thermally on the heat-sensitive lithographic printing plate precursor of the present invention before printing. Specifically, the image formation is conducted by direct image recording, for example, by a thermal recording head, scanning exposure with an infrared laser, high-illumination flash exposure, for example, with a xenon discharge lamp, or infrared lamp exposure. Of these, exposure by a solid high-power infrared laser, for example, a semiconductor laser or YAG laser emitting infrared light of a wavelength of 700 to 1,200 nm.

The printing plate precursor of the present invention having the latent image formed thereon can be mounted on a printing machine without any additional processing. With start of printing using ink and dampening water, the overcoat layer is removed with the dampening water, and simultaneously the exposed area of the hydrophilic layer is also removed to allow the ink to adhere to the bared portion of the ink-receptive layer thereby starting the printing.

The lithographic printing plate precursor of the present invention is also used for a printing system in which the printing plate precursor is mounted on a plate cylinder of a printing machine and exposed with a laser installed in the printing machine, and the image is developed on the machine for printing.

The present invention is described in more detail below by reference to the following examples, but the invention should not be construed as being limited thereto.

EXAMPLES 1 TO 5 AND COMPARATIVE EXAMPLES 1 to 2

[Preparation of Aluminum Substrate]

A 0.30 mm-thick rolled plate of aluminum of JIS A1050 composed of 99.5% of aluminum, 0.01% of copper, 0.03% of titanium, 0.3% of iron and 0.1% of silicon was subjected to surface graining using a 20% aqueous suspension of 400 mesh purmice stone (produced by Kyoritsu Yogyo Co., Ltd.) and a rotating nylon brush (6,10-nylon), and then washed thoroughly with water. The grained plate was immersed in an aqueous 15% sodium hydroxide solution (containing aluminum at a content of 4.5%) to be etched by dissolving the aluminum in a dissolution amount of 8 g/m$^2$ and washed with flowing water, followed by being neutralized by an aqueous 1% nitric acid solution. The plate was roughened electrolytically in an aqueous 0.7% nitric acid solution (containing aluminum at a content of 0.5%) by application of an alternate rectangular wave voltage of anode-side voltage of 10.5 V and cathode-side voltage of 9.3 v (current ratio r=0.90, current waveform described in JP-B-58-5796) at an anode-side current quantity of 240 C/dm$^2$. After water washing, the plate was etched by immersion in an aqueous 10% sodium hydroxide solution at 35° C. to dissolve aluminum in a dissolution amount of 0.9 g/m$^2$, followed by water washing. Then, the plate was immersed in an aqueous 30% sulfuric solution at 50° C. for desmatting, and washed with water.

Further, the plate was treated for porous anodic oxide later formation in an aqueous 9% sulfuric solution (containing aluminum at a content of 0.6%) at 53° C. with a direct current. Specifically, the electrolysis period was set 33 seconds and by controlling the current density, the anodic oxide layer of 3.7 g/m$^2$ was formed. The plate was then washed with water and dried to obtain an aluminum substrate. The center line average roughness Ra of the substrate was 0.53 μm.

[Preparation of Heat-sensitive Lithographic Printing Plate Precursor]

The coating liquid for ink-receptive layer shown in Table 1 was applied onto the aluminum substrate obtained above in an application amount of 12 cm$^3$/m$^2$ by means of a bar coater. The coated layer was dried by heating at 100° C. for one minute to obtain an ink-receptive layer having a dry coverage of 0.42 g/m$^2$.

TABLE 1

Formulation of Ink-Receptive Layer Coating Liquid (Unit: g)

| | Examples 1 and 2 | Examples 3 to 5 | Comparative Examples 1 and 2 |
|---|---|---|---|
| Epicoat 1009 (Epoxy resin, produced by Japan Epoxy Resins Co., Ltd.) | 1.39 | 1.60 | 1.60 |
| Epicoat 1001 (Epoxy resin, produced by Japan Epoxy Resins Co., Ltd.) | 0.34 | 0.20 | 0.20 |
| Flocculant: tetra-n-hexylammonium iodide | 0.05 | 0 | 0 |
| Methyl ethyl ketone | 13.5 | 13.5 | 13.5 |
| Propylene glycol monomethyl ether | 27.0 | 27.0 | 270 |

Then, onto the ink-receptive layer, the coating liquid for hydrophilic layer having the composition shown in Table 2 was applied in an amount of 12 $cm^3/m^2$ by means of a bar coater. The coated layer was dried by heating at 100° C. for one minute to obtain a hydrophilic layer having a dry coverage of 0.40 $g/m^2$.

TABLE 2

Formulation of Hydrophilic Layer Coating Liquid (Unit: g)

| | Example | | | | | Comparative Example | |
|---|---|---|---|---|---|---|---|
| | 1 | 2 | 3 | 4 | 5 | 1 | 2 |
| Methanol silica sol | 3.0 | 3.0 | 3.0 | 2.67 | 2.67 | 3.0 | 3.0 |
| Polyacrylic acid (weight average molecular weight: 250,000) | 0.1 | 0.1 | 0.1 | 0.1 | 0.1 | 0.1 | 0.1 |
| Light-heat converting agent (IR-1 shown below) | 0 | 0.08 | 0 | 0 | 0 | 0 | 0 |
| Flocculant (tetramethyl ammonium iodide) | 0 | 0 | 0.01 | 0 | 0 | 0 | 0 |
| Fine particulate silica (particle diameter: 0.5 to 1.0 μm) | 0 | 0 | 0 | 0.1 | 0 | 0 | 0 |
| Fine particulate silica (particle diameter: 1.0 to 2.0 μm) | 0 | 0 | 0 | 0 | 0.1 | 0 | 0 |
| Methyl lactate | 1.0 | 1.0 | 1.0 | 1.0 | 1.0 | 1.0 | 0 |
| Methanol | 19.4 | 19.4 | 19.4 | 19.6 | 19.6 | 19.4 | 20.4 |

(IR-1)

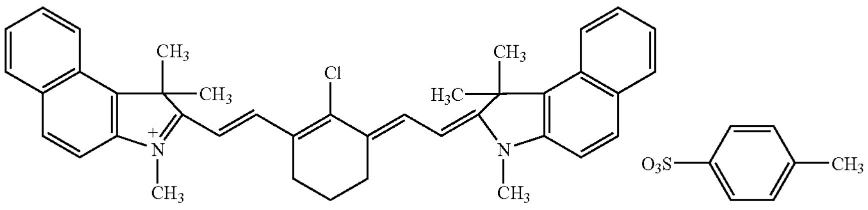

(IR-2)

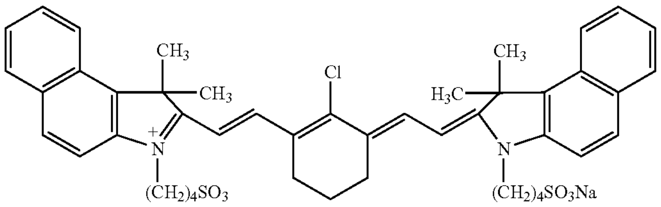

Onto the hydrophilic layer, the coating liquid for overcoat layer having the composition described below was applied in an amount of 12 $cm^3/m^2$ by means of a bar coater. The coated layer was dried by heating at 100° C. for 1.5 minutes to form an overcoat layer having a dry coverage of 0.15 $g/m^2$, thereby preparing a heat-sensitive lithographic printing plate precursor.

(Composition of Overcoat Layer Coating Liquid)

| | |
|---|---|
| Gum arabic (aqueous 28% solution) | 1.50 g |
| Light-heat converting agent (IR-2 shown above) | 0.177 g |
| Emulex #710 (aqueous 10% solution, surfactant produced by Nihon Emulsion Co., Ltd.) | 0.316 g |
| Magnesium acetate (aqueous 10% solution) | 0.038 g |
| Water | 39.57 g |

The surface and the cross section of each of the heat-sensitive lithographic printing plate precursors thus obtained were observed by scanning electron microscope. The printing plate precursors of Comparative Examples 1 and 2 were found to have no protrusion structure on the upper surface and the lower surface of the hydrophilic layer. The printing plate precursors of Examples 1 and 2 were found to have hemispherical to columnar protrusions of 0.5 to 2.0 μm in diameter and 0.5 to 1.0 μm in height on the upper surface of the hydrophilic layer and to have hemispherical protrusions on the lower surface of the hydrophilic layer penetrating into the ink-receptive layer with depth of 0.2 to 0.5 μm. The protrusion structure of the printing plate precursors of Examples 1 and 2 are considered to be formed due to flocculation of the colloidal silica caused by diffusion of a part of the flocculant from the ink-receptive layer into the hydrophilic layer.

The printing plate precursor of Example 3 was found to have hemispherical to hemi-ellipsoidal protrusions of 1.0 to 5.0 μm in diameter and 0.5 to 2.0 μm in height on the upper surface of the hydrophilic layer and to have a protrusion structure similar to that of Example 1 on the lower surface of the hydrophilic layer.

The printing plate precursors of Examples 4 and 5 were found to have protrusion structures corresponding to the size of silica particles added on the upper surface and the lower surface.

The lithographic printing plate precursor is mounted on a Trend Setter 3244VX (produced by CreoScitex Co.) and a latent image was formed by irradiation of an infrared laser beam (830 nm). The irradiation energy was 260 mJ/cm$^2$ for the printing plate precursor of Example 2, and 300 mJ/cm$^2$ for other printing plate precursors. The printing plate precursor having the latent image was mounted onto a printing machine SOR-M (produced by Heiderberg Co.) and printing was conducted using an aqueous 4 vol % solution of IF102 (produced by Fuji Photo Film Co., Ltd.) as dampening water, and a black ink GEOS-G(N) (produced by Dainippon Ink and Chemicals, Inc.). The printing durability was evaluated by the number of satisfactorily printed sheets. The resistance to stain was evaluated by occurrence of stain when an amount of the dampening water was decreased, and occurrence of stain at re-start of the printing after intermission for 60 minutes while keeping the plate on the printing machine. The results of evaluation obtained are shown in Table 3.

TABLE 3

Results of Printing Evaluation

| | | Example | | | | | Comparative Example | |
|---|---|---|---|---|---|---|---|---|
| | | 1 | 2 | 3 | 4 | 5 | 1 | 2 |
| Protrusion structure on hydrophilic layer surface | Upper surface | present | present | present | present | present | absent | absent |
| | Lower surface | present | present | present | present | present | absent | absent |
| Stain with decreased amount of dampening water | | hardly occur | hardly occur | hardly occur | hardly occur | hardly occur | easily occur | easily occur |
| Stain at re-start of printing after intermission | | none | none | none | none | none | background stain | background stain |
| Printing durability (number of sheets) | | 15,000 | 15,000 | 15,000 | 13,000 | 13,000 | 10,000 | 2,000 |

According to the present invention, a heat-sensitive lithographic printing plate precursor, which is capable of conducting plate-making by scanning exposure based on digital signal, can be used for printing without processing after exposure, and is improved in the resistance to stain at printing and the printing durability, can be provided.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A heat-sensitive lithographic printing plate precursor comprising on a support, a hydrophilic layer having a protrusion structure on at least one surface thereof, wherein the protrusions have a diameter of from 0.3 to 5.0 μm and a height of from 0.2 to 2.0 μm, and the hydrophilic layer comprises (i) a particulate hydrophilic substance having an average diameter ranging from 0.3 to 5.0 μm or (ii) a colloidal particulate and a flocculant.

2. The heat-sensitive lithographic printing plate precursor as claimed in claim 1, wherein (1) an ink-receptive layer and (2) the hydrophilic layer as claimed in claim 1 are provided in this order on the support.

3. The heat-sensitive lithographic printing plate precursor as claimed in claim 1, wherein (1) an ink-receptive layer, (2) the hydrophilic layer as claimed in claim 1, and (3) a hydrophilic overcoat layer removable on a printing machine are provided in this order on the support.

4. The heat-sensitive lithographic printing plate precursor as claimed in claim 1, wherein the hydrophilic layer is a layer formed by applying and drying a coating liquid containing a colloidal particulate oxide or hydroxide of at least one element selected from beryllium, magnesium, aluminum, silicon, titanium, boron, germanium, tin, zirconium, iron, vanadium, antimony, and transition metals; and a flocculant.

5. The heat-sensitive lithographic printing plate precursor as claimed in claim 2, wherein the hydrophilic layer contains a colloidal particulate oxide or hydroxide of at least one element selected from beryllium, magnesium, aluminum, silicon, titanium, boron, germanium, tin, zirconium, iron, vanadium, antimony, and transition metals, and the ink-receptive layer contains a flocculant soluble in a solvent for coating the hydrophilic layer.

6. The heat-sensitive lithographic printing plate precursor as claimed in claim 3, wherein the hydrophilic layer contains a colloidal particulate oxide or hydroxide of at least one element selected from beryllium, magnesium, aluminum, silicon, titanium, boron, germanium, tin, zirconium, iron, vanadium, antimony, and transition metals, and the ink-receptive layer contains a flocculant soluble in a solvent for coating the hydrophilic layer.

7. The heat-sensitive lithographic printing plate precursor as claimed in claim 5, wherein the flocculant is a compound capable of forming at least one kind of ion selected from a calcium ion, an aluminum ion, a sodium ion, a potassium ion, a lithium ion, an ammonium ion, a quaternary ammonium ion, a fluoride ion, a chloride ion, a nitrate ion, an acetate ion, a sulfate ion and a phosphate ion.

8. The heat-sensitive lithographic printing plate precursor as claimed in claim 6, wherein the flocculant is a compound capable of forming at least one kind of ion selected from a calcium ion, an aluminum ion, a sodium ion, a potassium ion, a lithium ion, an ammonium ion, a quaternary ammonium ion, a fluoride ion, a chloride ion, a nitrate ion, an acetate ion, a sulfate ion and a phosphate ion.

9. The heat-sensitive lithographic printing plate precursor as claimed in claim 2, wherein the hydrophilic layer is a layer formed by applying and drying a coating liquid which contains a solvent capable of dissolving an organic polymer in the ink-receptive layer at a content ranging from 1 to 40% based on the entire solvent of the coating liquid.

10. The heat-sensitive lithographic printing plate precursor as claimed in claim 3, wherein the hydrophilic layer is a layer formed by applying and drying a coating liquid which contains a solvent capable of dissolving an organic polymer in the ink-receptive layer at a content ranging from 1 to 40% based on the entire solvent of the coating liquid.

11. The heat-sensitive lithographic printing plate precursor as claimed in claim 1, wherein the protrusions are formed independently of surface shape of the support.

12. The heat-sensitive lithographic printing plate precursor as claimed in claim 1, wherein the protrusions are semispherical, ellipsoidal or columnar in shape.

* * * * *